United States Patent [19]

Syverson et al.

[11] Patent Number: 4,900,395
[45] Date of Patent: Feb. 13, 1990

[54] HF GAS ETCHING OF WAFERS IN AN ACID PROCESSOR

[75] Inventors: Daniel J. Syverson, Robbinsdale; Richard E. Novak, Plymouth, both of Minn.

[73] Assignee: FSI International, Inc., Chaska, Minn.

[21] Appl. No.: 334,343

[22] Filed: Apr. 7, 1989

[51] Int. Cl.⁴ .................. B44C 1/22; C03C 15/00; C03C 25/06
[52] U.S. Cl. .................................. 156/639; 134/3; 134/33; 156/640; 156/646; 156/657; 156/345
[58] Field of Search ............... 156/637, 639, 640, 643, 156/646, 653, 657, 662, 345; 252/79.1, 79.3; 134/2, 3, 4, 28, 30, 31, 33, 102, 157, 201

[56] References Cited

U.S. PATENT DOCUMENTS

| 3,879,597 | 4/1975 | Bersin et al. | 219/121 |
|---|---|---|---|
| 3,923,568 | 12/1975 | Bersin | 156/8 |
| 3,961,877 | 6/1976 | Johnson | 432/253 |
| 3,990,462 | 11/1976 | Elftmann et al. | 134/102 |
| 4,230,515 | 10/1980 | Zajac | 156/345 |
| 4,285,800 | 8/1981 | Welty | 204/298 |
| 4,303,467 | 12/1981 | Scornavacca et al. | 156/643 |
| 4,609,575 | 9/1976 | Burkman | 427/426 |
| 4,682,614 | 7/1987 | Silvernail et al. | 134/99 |
| 4,682,615 | 7/1987 | Burkman | 134/102 |
| 4,691,722 | 9/1987 | Silvernail et al. | 134/155 |
| 4,749,440 | 7/1988 | Blackwood et al. | 156/646 |

OTHER PUBLICATIONS

IBM Technical Disclosure Bulletin, vol. 19, No. 7, Dec., 1976 Etching of $SiO_2$ in Gaseous $HF/H_2O$, Authors: K. D. Beyer and M. H. Whitehill.

Primary Examiner—William A. Powell
Attorney, Agent, or Firm—Palmatier & Sjoguist

[57] ABSTRACT

Batch processing of semiconductor wafers utilizing a gas phase etching with anhydrous hydrogen fluoride gas flowing between wafers in a wafer carrier. The etching may take place in a bowl with the wafer carrier mounted on a rotor in the closed bowl. The etchant gas may include a small amount of water vapor, along with the anhydrous hydrogen fluoride gas, as may be needed to commence the etching process. The etching may take place with the wafers arranged in a stack in the wafer carrier and extending along or on the rotation axis.

26 Claims, 2 Drawing Sheets

HF GAS ETCHING OF WAFERS IN AN ACID PROCESSOR

This invention relates to gaseous etching of silicon wafers and more particularly to such etching of batches of wafers carried in linear wafer carriers and revolved in an enclosed chamber

BACKGROUND OF THE INVENTION

In the processing of semiconductor wafers of silicon and the like in the manufacture of circuit chips, etching of oxide layers or films on the surface of the wafer is an important aspect of the processing.

Much of the wafer processing in the past has utilized a wet etching process which involves the spraying of liquid acids and other liquid chemicals and deionized water onto silicon wafers confined in wafer carriers of plastic capable of withstanding the deteriorating effects of strong chemicals such as acids.

One or more such wafer carriers is carried on a variable speed turntable or rotor in a closed bowl of an acid processor machine. Such a machine has many variable phases to its operation including varying the speed of the rotor, sequentially spraying various liquid processing chemicals, and nitrogen gas for drying the wafers, bowl and rotor between various wet processing phases. One form of acid processor is illustrated and described in U.S. Pat. No. 3,990,462. Also see U.S. Pat. Nos. 4,609,575; 4,682,615 and 4,691,722 for variations in spray nozzle arrangements and other facilities for wet etch processing. Also see U.S. Pat. No. 4,682,614 for a nearly horizontal machine.

Etching of silicon wafers has been carried out with plasma of certain gases. A number of wafers were disclosed to have been simultaneously etched in U.S. Pat. No. 3,879,597 using plasma techniques.

Some early work in batch etching of $SiO_2$ with gaesous $HF/H_2O$ was disclosed in an *IBM Technical Disclosure Bulletin,* Vol. 19, No. 7, December, 1976, K. D. Beyer and M. H. Whitehill. A number of wafers in a tray were placed above an HF-solution, then rinsed in DI-water, and finally dipped in a nitric acid solution.

Etching of oxide films on silicon wafers has been accomplished, in recent years, with the use of anhydrous hydrogen fluoride gas. See U.S. Pat. No. 4,749,440. The etchant hydrogen fluoride gas is usually diluted with dry nitrogen gas. A small amount of moisture, either as a vapor mixed with the hydrogen fluoride gas or contained in the oxide film being etched, is necessarily present to react with the oxide in the film to initiate the etching process.

Such previous gas phase etching of oxide films of silicon wafers has been done only on one wafer at a time, in a chamber designed for and carrying only one wafer. See the '440 patent mentioned above and also see application Ser. No. 020,473, filed Mar. 2, 1987 at the U.S. Patent and Trademark Office under common ownership with the present application.

SUMMARY OF THE INVENTION

An object of the present invention is to improve the batch gaseous etching of semiconductor wafers for removing at least portions of the oxide films or layers from the surfaces thereof to facilitate more rapid processing of such wafers.

A feature of the invention is the method of batch processing of semiconductor wafers including etching of portions of the oxide film or layers thereon with the use of gaseous etchant including anhyrous hydrogen fluoride and within a closed chamber.

Another feature of the invention is the method of processing a multiplicity of silicon wafers carried in a wafer carrier and exposing the wafers to an etchant gas to remove portions of the oxide films on the wafers, while the wafers and carrier are revolved on the turntable or rotor in the closed chamber of an acid processing machine. Wafers are supported from their back sides adjacent the periphery, and are sprayed from sources all along the loose stack of wafers in a wafer carrier. Plasmas of plasma-producing gases are absent.

An advantage obtained is that many semiconductor wafers may be simultaneously etched while they remain in a wafer carrier with which they are commonly carried' and transported, and further, the improved gas phase etching may be carried out in equipment already available and in the manufacturing plants of wafer processing companies.

Where herein, the phrase "etchant gas" is used, it is intended to include whatever gas phase chemicals are utilized for etching portions of the oxide films or layers on the faces of the wafers, and such chemicals may include an active gaseous chemical such as anhydrous hydrogen fluoride gas, a diluent gas such as nitrogen gas, and in some instances a quantity of moisture in water vapor form if the water moisture is not contained within the film or oxide layer on the wafer.

DETAILED SPECIFICATION

Figure 1:
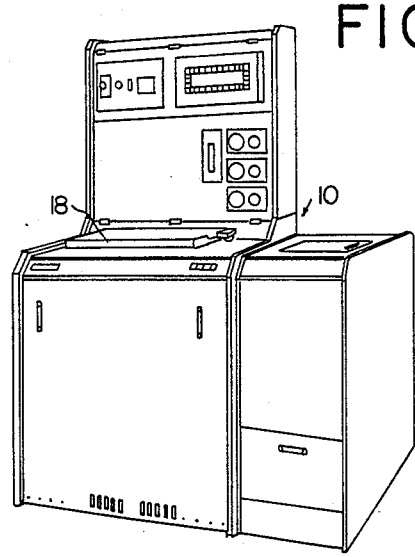
FIG. 1 is a perspective view of an acid processor machine.
Figure 2:
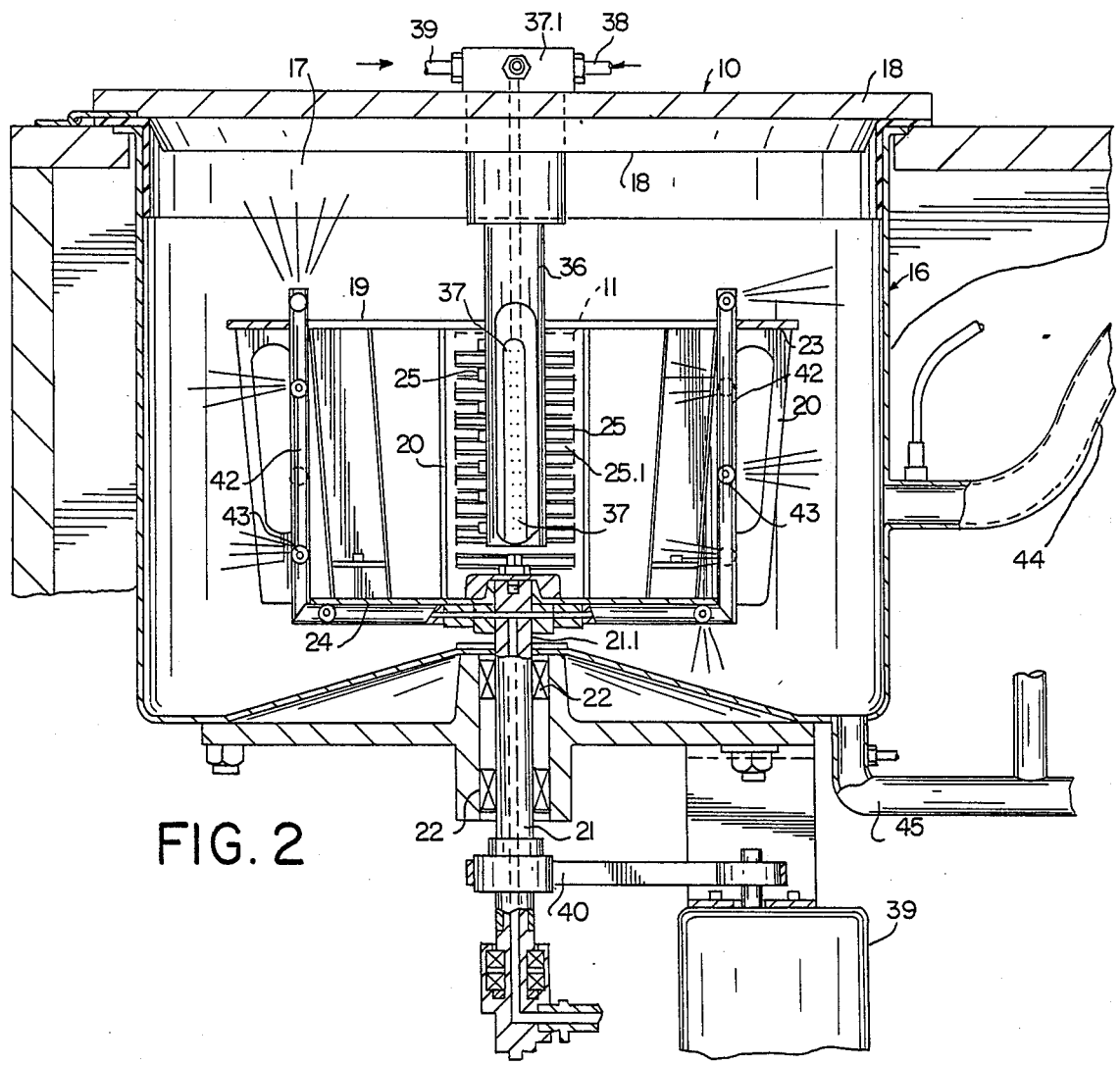
FIG. 2 is a section view through the bowl and rotor of one form of acid processing machine which is capable of carrying a number of wafer carriers about the periphery of the rotor or turntable.

In general, FIGS. 1 and 2 illustrate an acid processing machine capable of use in carrying out the method described herein, the acid processing machine 10 being of the type to mount and carry a multiplicity of wafer carriers or wafer cassettes 11 in spaced relation to the rotation axis and to carry the wafers therein orbitally around the rotation axis.

Figure 3:
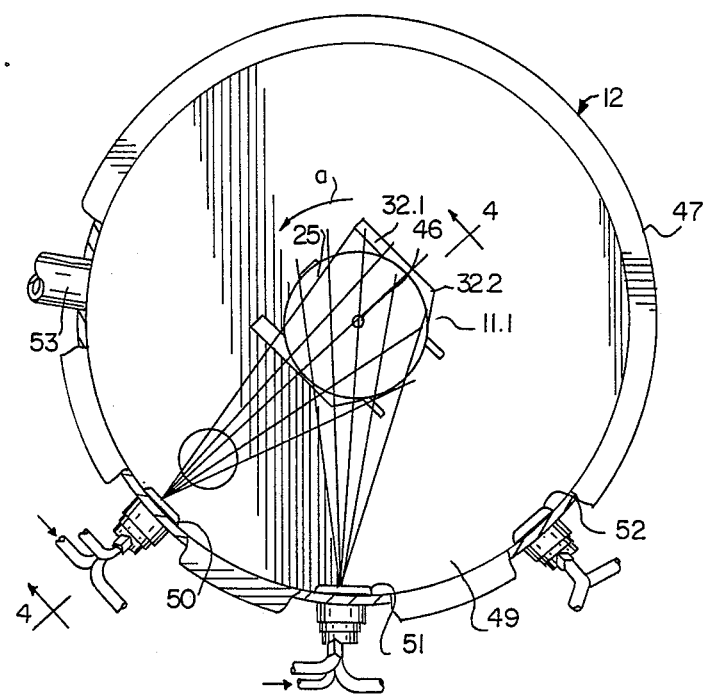
FIG. 3 is a top plan view of the open bowl of another form of acid processor machine capable of carrying out the present invention and showing a single wafer carrier with stacked wafers located substantially concentrically of and on the rotation axis.
Figure 4:
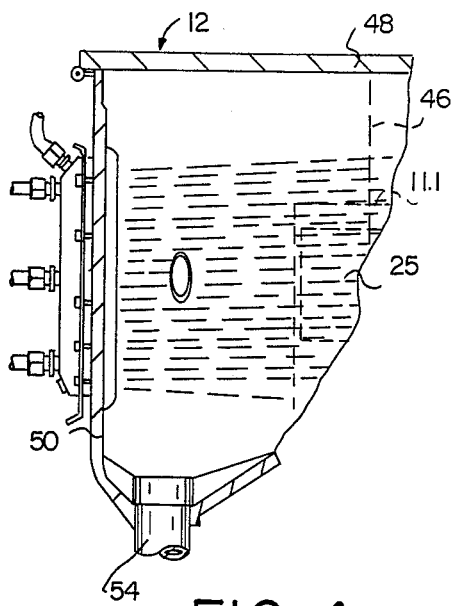
FIG. 4 is a partial detail section view taken approximately at 4—4 of FIG. 3.

FIGS. 3 and 4 illustrate a different type of acid processing machine which is indicated in general by the numeral 12 and which mounts such a wafer carrier 11, or 11.1 as shown, approximately on the rotation axis of the machine.

Figure 5:
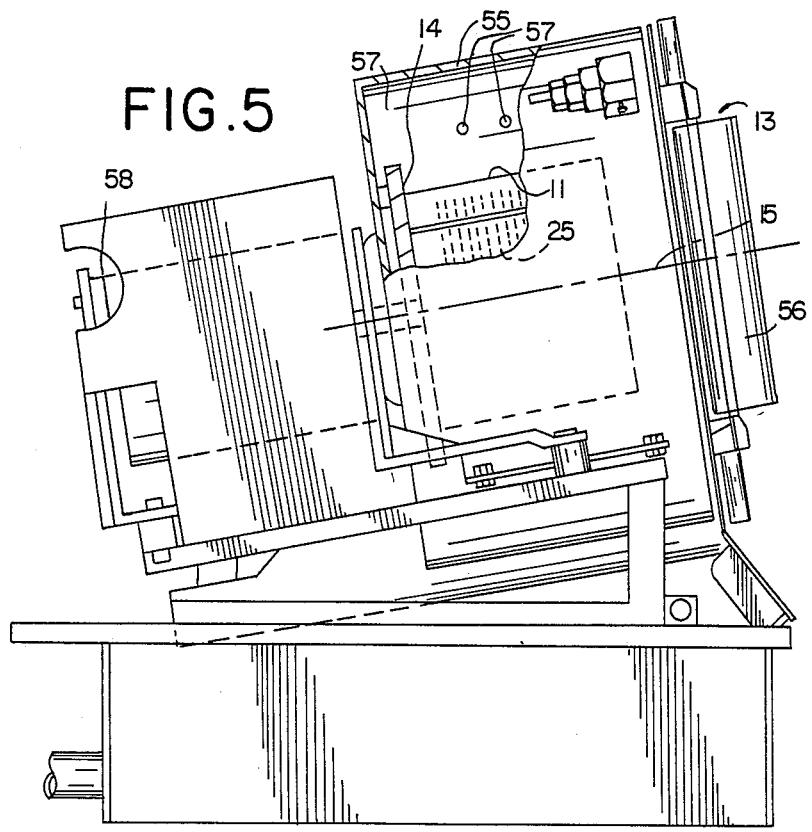
FIG. 5 is an elevation view of another form of acid processor capable of carrying out the present invention and having its bowl and rotor oriented at a slight angle off horizontal so that the rotation axis is nearly horizontal.

In the third form illustrated in FIG. 5, the acid processing machine indicated by the numeral 13, is capable of being used to carry out the method set forth herein, and in this instance the wafer carrier 11 is mounted on a rotor 14 revolving about an axis 15 which is merely horizontal, but at a slight angle with the horizontal. All of these three forms of acid processor are capable of being used to carry out the method described herein.

In the acid processor illustrated in FIGS. 1 and 2, the machine 10 incorporates a bowl 16 which defines a processing chamber 17 which is closed by the cover 18. The bowl and cover are preferably made of plastic such as Teflon PFA but may be formed of stainless steel. In this form, the rotor 19, also of Teflon PFA or stainless steel, defines a multiplicity of compartments 20, symmetrically disposed around the periphery of the rotor 19 and equidistant from the rotation axis of the rotor which is supported on a shaft 21 and mounted in bearings 22. The compartments 20 of the rotor 19 are tied together by a top plate 23 and a bottom plate 24 and are of such a size as to receive and confine such a wafer carrier 11 loaded with silicon wafers 25. The silicon wafers are arranged in a stack wherein each of the wafers is aligned with and confronts adjacent wafers, and wherein each of the wafers is oriented transversely of and normal to the rotation axis of rotor 19. The wafer carrier 11 and the wafers 25 therein are spaced from the rotation axis and revolve with the rotor about the rotation axis.

Figure 6:
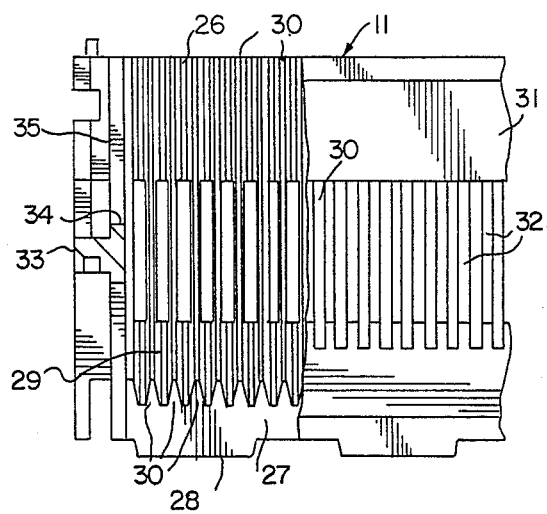
FIG. 6 is a detail partial side elevation view of a wafer carrier for holding wafers being processed according to the present invention.

As will be seen in FIG. 6, the wafer carrier is slotted, apertured or foraminous in nature and has an open top 26, which comprises the front of the carrier when it is standing on end as it is mounted in the rotor 19 of the machine. The wafer carrier 11, which is formed of PFA Teflon, otherwise known as the perfluoroalkoxy melt processible plastic which is highly resistant to the deteriorating effect of strong chemicals such as acids, also has an open bottom 27 between the inwardly offset lower portions 28 of the carrier as to support the wafers in grooves 29 which form seats for the wafers as they are carried in the wafer carrier. Between the several grooves 29 are a multiplicity of ribs or teeth 30 which extend from the lower portion entirely upwardly throughout the sidewall so as to keep the wafers in spaced and aligned relation with each other. The sidewall 31 in which the teeth or ribs 30 are incorporated, are provided with a multiplicity of slots 32 to facilitate passage of etchant gas through the wafer carrier in order to obtain access to the wafers 25 confined therein. When the wafer carrier 11 is placed in the rotor, the back sides of the wafers are supported at their edge portions by the ribs 30 so as to expose the entire front or top side of the wafer to the atmosphere in the chamber 17, and epxose substantially all portions of the back sides of the carrier to the atmosphere within the chamber 17.

The wafer carrier 11 also has an end wall consisting of a crossbar 33 which may have any of a number of configurations, and may have flanges 34 for strengthening it. The crossbar 33 extends entirely across the wafer carrier and the sidewalls 31 may be strengthened relative to the crossbar as by gussets 35.

In the machine 10 as seen in FIG. 2, a central spray post 36 extends from the cover 18 and extends downwardly at approximately the rotation axis of rotor 19 and along the wafer carrier 11 and the stack of wafers 25 therein. The spray post has a multiplicity of nozzles 37 therein for directing the process gases including the etchant gas onto the wafers as they revolve with the rotor in the bowl 16. Etchant gas and other gases are supplied through a header 37.1 which is connected to several gas lines 38, 38.1 through which gas is supplied to the nozzles 37 for spraying onto the wafers and along the full length of the stack of wafers in the bowl.

The rotor is driven by a variable speed motor 39 which is connected to the shaft 21 as by a drive belt 40. In this form, the shaft 21 has a flow passage 21.1 therein for delivering fluids into the manifold pipes 42 and the nozzles 43. These nozzles 43 are particularly useful in directing rinsing or cleaning fluids such as deionized water for the chamber 17 when desired, and drying gas, such as nitrogen, in order to assure that the inside of the bowl 16 remains dry during processing. An exhaust duct 44 is provided to exhaust gases out of the chamber 17 so that a continuing flow of gas may be provided when desired. A drain 45 is also provided in order to remove rinsing or cleaning fluids during certain cleansing operations as may be needed.

It will be recognized that in the wafer carriers 11 when they are carried on the rotor, the wafers 25 are spaced from each other by open spaces 25.1 so that gases may pass across the faces of the wafers to accomplish the etching process.

The wafer carrier 11 is similar to that illustrated in U.S. Pat. No. 3,961,877, but it should be understood that other similar carriers would be useful in this machine for carrying out the process described and claimed herein.

The paricular etching process is described in considerable detail in U.S. Pat. No. 4,749,440 which is incorporated herein by reference and need not be repeated for an understanding of the present invention. The etchant gases are supplied through the nozzle orifices 37 and are directed toward the edges of the wafers 25 and through the spaces 25.1 between the wafers as to traverse the faces of the wafers and accomplish etching of the oxides on the faces of the wafers. Simultaneous etching of a multiplicity of wafers as carried in the carrier 11 is accomplished because there is a multiplicity of locations at which the gas emanates from the spray post 36, and it will be seen that the orifices 37 are arranged in a row along the face of the spray post 36. Of course as the rotor revolves, the wafers in the several carriers 11 spaced around the periphery of the rotor 19 will be progressively subjected to the spray of etchant gas emanating from the central spray post.

The following TABLE I reports the results obtained in gas phase etching carried out in an acid processor substantially identical to that of FIG. 2.

TABLE 1

| | | | | | | | | | |
|---|---|---|---|---|---|---|---|---|---|
| | | | | | TESTING SUMMARY | | | | |
| Test # | Time | $N_2$ l/min. | Vapor cc/min. | Hf/ min | Oxide Removed Å | Rotation Speed/RPM $\sigma$ | % CV | Particle Å | Residue |
| 1 | 5.0' | 7.51 | 3.01 | 125 cc | Cleared | | | 2292 | Yes |
| 2 | 4.0' | 7.51 | 3.01 | 125 cc | Cleared | | | 2572 | Yes |
| 3 | 3.0' | 7.51 | 3.01 | 125 cc | Cleared | | | 1585 | Yes |
| 4 | 1.0' | 7.51 | 3.01 | 375 cc | Cleared | | | 678 | Yes |

TABLE 1-continued

TESTING SUMMARY

| Test # | Time | N₂ l/min. | Vapor cc/min. | Hf/ min | Oxide Removed Å | Rotation Speed/RPM σ | % CV | Particle Å | Residue |
|---|---|---|---|---|---|---|---|---|---|
| 5 | 20" | 7.51 | 3.01 | 375 cc | 269 A | (25) | 9.3 | 437 | No |
| 6 | 20" | 7.51 | 3.01 | 375 cc | 243 A | (17.8) | 7.3 | 311 | No |
| 7 | 20" | 7.51 | 3.01 | 125 cc | 36 A | | 1.7 | 744 | No |
| 8 | 20" | 7.51 | 3.01 | 125 cc | 21 A | | 0.8 | 554 | No |
| 9 | 40" | 7.51 | 3.01 | 125 cc | 108 A | (5.8) | 5.4 | | No |
| 10 | 20" | 7.51 | 1.51 | 125 cc | | | No Etch | | |
| 11 | 60" | 7.51 | 1.51 | 125 cc | 270 | (27) | 10.0 | | No |
| 12 | 20" | 15.01 | 1.51 | 125 cc | | | No Etch | | |
| 13 | 60" | 15.01 | 1.51 | 125 cc | 879 | (111) | 12.7 | | Yes |
| 14 | 60" | 15.01 | 1.51 | 125 cc | 491 | (107) | 21.9 | | Yes |

In FIGS. 3 and 4 a similar, but slightly different, form of acid processing machine is illustrated, and a slightly different form of wafer carrier, 11.1 is utilized. This wafer carrier 11.1 has additional slots 32.1 and 32.2 so that the sidewalls of the wafer carrier are highly foraminous as to provide minimum restriction to the flow of sprayed etchant gases. The wafer carriers 11 and 11.1 may be used interchangeably in the several forms of machines illustrated herein. It will be seen in the form of processing machine of FIG. 3 that the wafers 25 are supported in substantially the same manner in the wafer carrier as in FIG. 2 and the wafers revolve with the carrier 11.1 as indicated by the arrow "a" and about a rotation axis 46 which extends along and through the wafers oriented in the stack. Again, the bowl 47 has a cover 48 as to close the interior chamber 49. Spray of the etchant gas may emanate from one or more of the nozzles 50, 51, and the diluent gases for purging the chamber may be also supplied through one of the nozzles 50, hines illustrated herein. It will be seen in the form of processing machine of FIG. 3 that the wafers 25 revolve with the carrier 11.1 as indicated by the arrow "a" and about a rotation axis 46 which extends along and through the wafers oriented in the stack. Again, the bowl 47 has a cover 48 as to close the interior chamber 49. Spray of the etchant gas may emanate from one or more of the nozzles 50, 51, and the diluent gases for purging the chamber may be also supplied through one of the nozzles 50, films or layers that may be on the faces of the wafers.

A duct 53 is provided for allowing the gases to escape as desired in order to provide circulation, and a drain 54 is provided to allow liquids used to clean the inside of the chamber to escape. It should be recognized however, that in the ordinary course of processing the wafers with gas phase etching, no liquid is ordinarily used or sprayed onto the wafers. However, there are some instances in which the etching will be followed by a spray of deionized water for removing particulate.

In the form illustrated in FIG. 5, the bowl 55 is oriented at a nearly horizontal position as to embrace the rotation axis 15 of the rotor 14. An openable cover 56 facilitates obtaining access into the interior 57 of the bowl or chamber. Again, the wafers 25 are oriented in a stack along the rotation axis 15 and in this instance, the wafers are intersected by the rotation axis. Nozzles 57 in the sidewall of the bowl direct etchant gas into the chamber and toward the edges of the wafers as to traverse the faces of the wafers which are carried in the foraminous wafer carrier within the chamber. The rotor 14 and wafer carrier in bowl 55 is slanted slightly as to cause the wafers to be supported in the ribs within the carrier as described in connection with FIG. 2.

In this form, a motor 58 is direct-connected to the rotor 14 to produce the necessary rotation of the rotor and the wafers carried thereby.

It will be recognized that there is disclosed herein the method of processing a multiplicity of semiconductor silicon wafers in an acid processing machine which is normally constructed for the use of wet etching liquids. The etchant gases are supplied into the chamber for traversing the faces of the wafers being processed therein. The method described may also be used in connection with plasmas of plasma forming gases supplied into the chamber. It may be that the rotor revolves relative to the nozzles, as illustrated, but the spraying nozzles may also be revolved around the wafer carrier carrying a stack of the wafers as to produce the necessary relative rotation between the sources of the spray gases from which the etchant gas emanates, and the wafers carried by the rotor and wafer carrier. Of course the spray nozzles and the bowls and other hardware therein must be of such a nature as to resist the deteriorating effect of the strong etchant gas.

I claim:

1. In the art of gas phase etching of semiconductor wafers for removing portions of the oxide films on such wafers, the method consisting in
    mounting a multiplicity of such semiconductor wafers into a wafer carrier wherein the wafers are in spaced and confronting relation with each other, and supplying etchant gas including anhydrous hydrogen fluoride gas to flow between the wafers and expose portions of the wafers to the etchant gas for etching portions of the oxide films thereon.

2. The method according to claim 1 and revolving the wafer carrier and the wafers therein.

3. The method according to claim 2 wherein the revolving is about an axis extending transversely of said wafers.

4. The method according to claim 3 wherein the wafers are on the axis which passes through the wafers.

5. The method according to claim 3 wherein the wafers are adjacent to and spaced from the axis.

6. In the art of gas phase etching of semiconductor wafers for removing portions of the oxide films on such wafers, the method consisting in
    mounting a wafer carrier loaded with a multiplicity of such wafers, onto a rotor in the bowl of a processing machine,
    and supplying of etchant gas into the bowl and revolving the rotor and carrier and wafers for exposing portions of the wafers to the gas for etching portions of the oxide films on the wafers.

7. The method according to claim 6 wherein the etchant gas includes anhydrous hydrogen fluoride gas.

8. The method according to claim 6 wherein the etchant gas is directed toward and between a multiplicity of such wafers.

9. In the art of gas phase etching of semiconductor wafers for removing portions of the oxide films from the front sides of such wafers, the method consisting in
mounting a multiplicity of such semiconductor wafers in spaced and confronting relation to each other by supporting each wafer from its back side at its outer perphery adjacent its edge,
and supplying etchant gas between the wafers and onto said portions to be etched.

10. The method according to claim 9 and exposing portions of both the front sides and back sides of the wafers to the etchant gas for etching.

11. In the art of gas phase etching of semiconductor wafers for removing portions of the oxide films on such wafers, the method consisting in
mounting a multiplicity of such semiconductor wafers in spaced and confronting relation with each other
and supplying and directing etchant gas from multiple spray sources and toward portions of a plurality of wafers as to flow the etchant gas between the wafers and expose portions of the oxide films to the gas to be etched thereby.

12. The method according to claim 11 and producing relative rotary movement between the wafers and certain of the spray sources.

13. In the art of gas phase etching of semiconductor wafers for removing portions of the oxide films on such wafers, the method consisting in
assembling and arranging a multiplicity of such wafers into spaced, aligned, and confronting and relatively stationery relation to each other and into a loose and elongate stack of wafers,
moving the stack of wafers endways into a closeable bowl and confining the stack in the bowl,
and supplying etchant gas into the bowl for exposing portions of the wafers to the gas for etching portions of the oxide films on the wafers.

14. The method according to claim 13 and rotating the stack during at least part of the exposing of the wafers to the gas.

15. The method according to claim 13 wherein the etchant gas includes a portion of anhydrous hydrogen fluoride gas.

16. The method according to claim 13 wherein the etchant gas is absent a plasma of a plasma producing gas.

17. A method of etching portions of oxide films or layers on semiconductor wafers, comprising
stacking and retaining a multiplicity of such wafers in aligned and spaced relation with each other,
mounting the stacked wafers onto the rotor in the bowl of a processing machine and orienting the stack along the rotation axis so that the wafers lie transversely of the rotation axis,
and spraying etchant gas into the bowl and toward the edges of the wafers while the rotor and wafers are revolved to cause the gaseous etchant to travel across portions of the oxide films on the wafers and to produce etching of such portions.

18. A method of etching according to claim 17 wherein said spraying of etchant gas is directed across the faces of the revolving wafers.

19. A method of etching according to claim 17 wherein said spraying emanates from a multiplicity of locations along the stack of wafers.

20. A method of etching according to claim 17 wherein the mounting of the stacked wafers includes positioning said stack away from and in spaced relation with the rotation axis of the rotor.

21. A method of etching according to claim 20 and said spraying of etchant gas emanating from a location adjacent the rotation axis of the rotor and outwardly therefrom onto the stacked wafers.

22. A method of etching according to claim 18 and said spraying of etchant gas emanating from locations widely spaced from the rotation axis.

23. A method of etching according to claim 17 wherein said mounting of the stacked wafers includes locating the stacked wafers along the rotation axis of the rotor and wherein the axis extends through the wafers in the stack.

24. A method of etching according to claim 17 wherein said stacking and retaining of wafers includes confining the wafers in a foraminous wafer carrier which allows access by the etchant gas to the wafers.

25. In the art of gas phase etching of silicon and the like for removing portions of the oxide films on such wafers, the method consisting in
mounting a foraminous wafer carrier loaded with a multiplicity of such wafers into the bowl of a processing machine,
spraying from nozzles etchant gas into the bowl and toward the edges of the wafer to cause the etchant gas to travel across portions of the oxide films on the wafers and to produce etching of such portions,
and producing relative rotation between the wafer carrier and nozzles around a rotation axis extending endways of the stack of wafers.

26. A method of etching according to claim 25 wherein the supplying of etchant gas emanates from a multiplicity of locations and nozzles at a multiplicity of locations along the stack of wafers.

* * * * *